(12) United States Patent
Daamen et al.

(10) Patent No.: US 9,337,597 B2
(45) Date of Patent: May 10, 2016

(54) BUSBAR CONNECTION SYSTEM FOR USE WITH A POWER DISTRIBUTION SYSTEM, AND ELECTRICAL DEVICE INCLUDING THE BUSBAR CONNECTION SYSTEM

(71) Applicant: TE Connectivity Nederland BV, 's-Hertogenbosch (NL)

(72) Inventors: Ronald Nico Adriaan Daamen, Vught (NL); Ruud Van Den Brink, Beuningen (NL); Sebastiaan Roger Neerincx, Tilburg (NL)

(73) Assignee: TE Connectivity Nederland BV, 'S-Hertogenbosch (NL)

( * ) Notice: Subject to any disclaimer, the term of this patent is extended or adjusted under 35 U.S.C. 154(b) by 0 days.

(21) Appl. No.: 14/320,226

(22) Filed: Jun. 30, 2014

(65) Prior Publication Data
US 2015/0009607 A1    Jan. 8, 2015

(30) Foreign Application Priority Data

Jul. 8, 2013 (EP) .................................. 13175573

(51) Int. Cl.

| | |
|---|---|
| H01R 13/60 | (2006.01) |
| H01R 27/02 | (2006.01) |
| H01R 13/629 | (2006.01) |
| H02B 1/20 | (2006.01) |
| H01R 25/14 | (2006.01) |
| H01R 12/70 | (2011.01) |
| H01R 12/72 | (2011.01) |
| H05K 7/14 | (2006.01) |

(52) U.S. Cl.
CPC ............ *H01R 27/02* (2013.01); *H01R 12/7088* (2013.01); *H01R 12/721* (2013.01); *H01R 13/629* (2013.01); *H01R 25/142* (2013.01); *H02B 1/205* (2013.01); *H05K 7/1457* (2013.01)

(58) Field of Classification Search
CPC .. H01R 13/518; H01R 23/025; H01R 13/514; H04Q 1/142; G02B 6/3897
USPC ............................ 439/540.1, 541.5, 108, 947
See application file for complete search history.

(56) References Cited

U.S. PATENT DOCUMENTS

| | | | |
|---|---|---|---|
| 3,704,394 A | 11/1972 | Johnson | |
| 3,725,843 A | 4/1973 | Johnson | |
| 4,241,381 A * | 12/1980 | Cobaugh | ............... H05K 7/1457 361/624 |

(Continued)

OTHER PUBLICATIONS

Search Report for EP Application No. EP2824767, Nov. 19, 2013, 1 page.

*Primary Examiner* — Phuong Dinh
(74) *Attorney, Agent, or Firm* — Faegre Baker Daniels LLP

(57) ABSTRACT

The invention relates to an improved busbar connection system, an electrical device incorporating same, and an electrical system comprising at least one electrical device. Such a busbar connection system comprises for receiving and for electrically contacting at least two conductors of a busbar, and a signal connector for receiving and for electrically contacting a link module with a plurality of contact pads. The busbar connector has at least two, spaced apart, openings defined by an open cross-section along a mating direction that enable the busbar connector to partially surround, on opposite sides, each of the at least two conductors of the busbar. The signal connector has an opening defined by a closed cross-section along the mating direction that enables the signal connector to guide the link module into a contacting position for electrically contacting the plurality of contact pads.

15 Claims, 7 Drawing Sheets

(56) References Cited

U.S. PATENT DOCUMENTS

| | | | | |
|---|---|---|---|---|
| 4,755,145 A | * | 7/1988 | Johnson | H05K 7/1457 439/101 |
| 5,139,426 A | * | 8/1992 | Barkus | H01R 12/7088 439/108 |
| 5,478,259 A | * | 12/1995 | Noschese | H01R 12/721 439/108 |
| 6,848,953 B2 | * | 2/2005 | Schell | H01R 13/055 439/825 |
| 7,581,972 B2 | | 9/2009 | Daamen | |
| 8,684,772 B2 | * | 4/2014 | Yu | H01R 13/514 439/717 |

\* cited by examiner

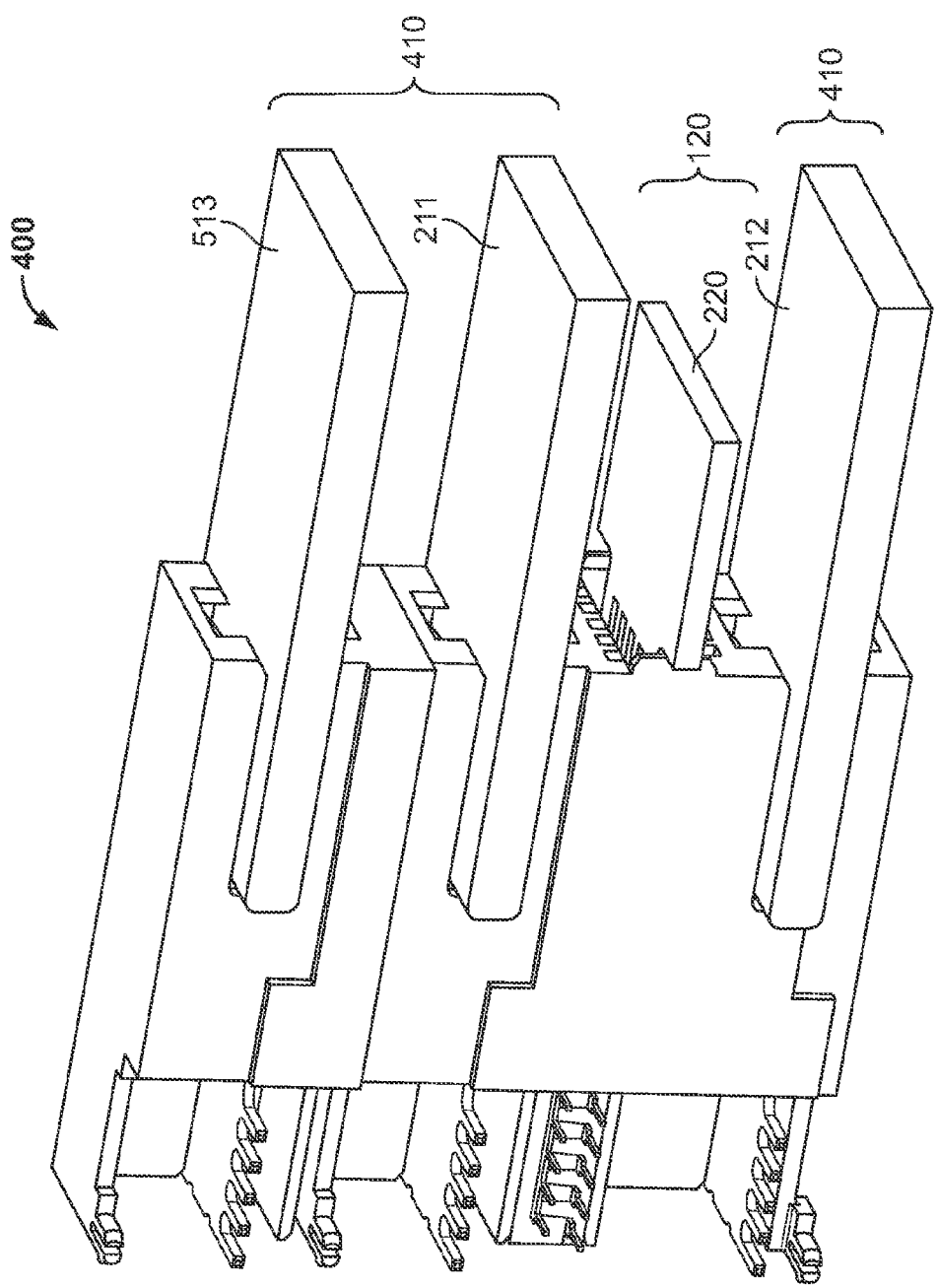

BUSBAR CONNECTION SYSTEM FOR USE WITH A POWER DISTRIBUTION SYSTEM, AND ELECTRICAL DEVICE INCLUDING THE BUSBAR CONNECTION SYSTEM

This application claims priority from European Patent Application EP13175573.8 filed Jul. 8, 2013, the subject matter of which is incorporated herein by reference.

BACKGROUND

The invention relates to a busbar connection system for mating with a power distribution system and a power distribution system comprising such a busbar connection system.

Busbar connection systems are commonly used with electrical power distribution systems in order to distribute electrical power from a power source to a number of electrical devices each comprising one busbar connection system. The power distribution system includes a busbar for connecting busbar connection systems of each electrical device. The power distribution systems may be provided in a rack shaped arrangement.

The power distribution systems may also be arranged in a plurality of sub-racks, wherein each sub-rack includes a separate busbar (for instance with a length of two meters or more) for connecting busbar connection systems of each electrical device. In any case, the electrical devices are configured to receive the distributed electrical power from the power source via the busbar connection systems.

Such an electrical power distribution system usually comprises at least two conductors which are spaced apart from each other in a predetermined distance in order to be connected to the number of electrical devices. Alternatively, in case of a subdivided electrical power distribution system, each sub-rack usually comprises at least two conductors which are spaced apart from each other in a predetermined distance in order to be connected to the number of electrical devices. The at least two conductors form the busbar of the power distribution system.

The conductors of the busbar are typically realized as horizontal strip conductors spaced apart in a predetermined distance, such as 19-25 mm. Exemplarily, the horizontal strip conductors of the busbar may have a length of approximately 400 mm. The length of 400 mm of the horizontal strip conductors of the busbar is preferential since it enables its application in an sub-rack with a width 19 inch or 482.6 mm. In other words, the length of the horizontal strip conductors of the busbar is determined by the width of the case of the electrical power distribution system, e.g. by the width of the sub-rack.

Specifically, in case of the subdivided electrical power distribution system described above, the plurality of sub-racks may additionally be connected via vertical strip conductors to the power source. In more detail, vertically arranged main power conductors distribute the electrical power from the power source to the plurality of sub-racks in order to supply the electrical devices provided therein.

Each of the electrical devices comprises at least two pluggable connectors in order to respectively connect to one of the conductors. The pluggable connectors of every electrical device are vertically spaced apart from each other in the predetermined distance of the two conductors of the electrical power distribution system.

An exemplary busbar connection system is described in EP 2 048 746 A1. The busbar connection system comprises at least two pluggable connectors spaced apart from each other in order to respectively accommodate at least one of at least two of the conductors which are spaced apart from each other in a certain distance. Each of the connectors comprises at least one contact member for contacting the respective conductor and at least one urging member configured to clasp the contact member for providing contact force between the contact member and the conductor. The contact member and the urging member of at least one of the connectors are flexible in a direction transverse to a mating direction of the conductors to permit compensating for a deviation of the distance between the conductors from a predetermined distance.

According to recent developments, efficiency of the power distribution system can be improved by enabling power distribution control. In more detail, depending on the demand for power of the connected electrical devices, an improved power distribution system may control the power supply; namely, it may increase or reduce the amount of power to be provided. For this purpose, the improved power distribution system is required, for instance, to determine the number of connected electrical devices in order to estimate the demand for power to be supplied.

SUMMARY

In this respect, it is an object of the invention to suggest an improved busbar connection system which overcomes the disadvantage noted above, i.e. which provides for a signal connection when used with an improved power distribution system. In more detail, the proposed busbar connection system includes a busbar connector for connecting at least two conductors of the busbar and a signal connector which enables receiving, in the busbar connection system, a contact insert with a plurality of contact members.

The signal connector of the improved busbar connection system enables connecting a link module included in the power distribution system and allows for a signal connection between improved busbar connection system and the power distribution system.

The object of the invention is attained by the subject-matter of the independent claims. Advantageous embodiments are subject to the dependent claims.

In the context of the invention, the term "busbar connection system" refers to the implementation of power and signal connection means on the electrical device's side. In more detail, the busbar connection system allows for mating with a power distribution system. In this respect, the busbar connection system provides a detachable connection to the power distribution system.

Further, in the context of the invention, the term "power distribution system" refers to the counterpart to the busbar connection system. The power distribution system includes a busbar and a link module. In this respect, the power distribution system enables for a power and signal connection to one or more busbar connection systems at a same time.

According to a first aspect of the invention, a busbar connection system is proposed with a configuration that allows for integration of a busbar connector for power transmissions and a signal connector for data transmissions. Specifically, the structure of the busbar connection system enables establishing both a power and a data connection with the power distribution system in a single mating movement. In more detail, due to at least two openings of the busbar connector and an opening of the signal connector being positioned at least partially on the front-face of the busbar connection system, the single mating movement with the power distribution system 200 becomes possible.

According to an embodiment in line with the first aspect of the invention, a busbar connection system is suggested for mating with a power distribution system 200 including a busbar and a link module 220. The busbar connection system comprises a busbar connector 110 or 410 for receiving at least two conductors of the busbar 211 and 212 and for electrically contacting each of the at least two conductors. The busbar connection system comprises a signal connector 120 for receiving the link module 220 with a plurality of contact pads 221-230 and for electrically contacting each of the plurality of contact pads 221-230. The busbar connector of the busbar connection system has at least two, spaced apart, openings 111 and 112 defined by an open cross-section along a mating direction, the at least two openings 111 and 112 enable the busbar connector to partially surround, on opposite sides, each of the at least two conductors of the busbar. Further, the signal connector 120 of the busbar connection system has an opening 111 and 112 defined by a closed cross-section along the mating direction, the opening 111 and 112 enables the signal connector 120 to guide the link module 220 into a contacting position for electrically contacting the plurality of contact pads.

According to a more detailed embodiment of the busbar connection system, the cross-section defining the at least two openings of the busbar connector is the same cross-section defining the opening of the signal connector, and/or the signal connector is arranged between two of the at least two openings of the busbar connector.

According to another more detailed embodiment, the busbar connection system further comprises a housing 140 integrally manufactured to house the busbar connector 110 410 and the signal connector 120. Optionally, the busbar connection system is provided on its side-face with a joint 341 and 342 for joining the busbar connection system to another busbar connection system.

According to further more detailed embodiment of the busbar connection system, the signal connector 120 further includes guiding rails 122 for guiding the link module 220 into the contacting position, the guiding rails 122 extending along the mating direction of the busbar connection system.

According to yet another more detailed embodiment, the busbar connection system further comprises a contact insert 123 detachably arranged within the signal connector 120 including a plurality of contact members 124-133 for electrically contacting the plurality of contact pads of the link module 220, respectively.

According to an even further more detailed embodiment of the busbar connection system, the plurality of contact members 124-133 of the contact insert 123 are card-edge style contacts configured to apply a contact force in a direction essentially perpendicular to the mating direction.

According to another more detailed embodiment of the busbar connection system, the contact insert 123 is provided with a same number of the contact members 124-133 for electrically contacting respective contact pads 221-230 of the link module 220 on opposite sides.

According to further more detailed embodiment of the busbar connection system, a tip portion 124'-133' of each of the plurality of contact members 124-133 of the contact insert 123 respectively engages into one of a plurality of recesses 143-152 at the inner circumference of the opening 121 of the signal connector 120.

According to yet another more detailed embodiment of the busbar connection system, the plurality of contact members 124-133 of the contact insert 120 are provided with angled terminals for connection to a system board 150.

According to an even further more detailed embodiment of the busbar connection system, the busbar connector 110 and 410 includes at least two contact members 113 and 114 respectively arranged within the at least two openings 111 and 112; and each of the contact members 124-133 is configured: to electrically contact the respective conductor at three contact points, and to apply a contact force on opposite sides onto the respective conductor of the busbar.

According to another more detailed embodiment of the busbar connection system, the front and the rear face of the busbar connector 110 and 410 includes further openings enabling air to flow through the busbar connection system.

According to further more detailed embodiment, the busbar connection system further comprises fixtures 142 for fixing the busbar connection system to a system board 150 in a direction with respect to the mating direction.

According to yet another more detailed embodiment of the busbar connection system, the fixtures 142 are configured to fix the busbar connection system 110 onto the system board 150 in essentially an orthogonal direction with respect to the lateral extent of each of the at least two openings 111 and 112 of the busbar connector 110.

According to another embodiment in line with the first aspect of the invention, an electrical device is proposed comprising at least one busbar connection system 100, 300 or 400 according to one of the previously described embodiments; and a system board 150 for mounting the busbar connection system 100, 300 or 400 and for power transmission via the busbar connector(s) 110 or 410 and for data transmission via the signal connector(s) 120 with the power distribution system 200 or 500.

According to a further embodiment in line with the first aspect of the invention, an electrical system is suggested comprising: an electrical device according to the previously described embodiment; and a power distribution system 200 or 500, the power distribution system including a busbar 210 or 510 and a link module 220, wherein the link module 220 is a printed circuit board, PCB, with a same number of contact pads 221-230 on opposite sides.

The accompanying drawings are incorporated into the specification and form a part of the specification to illustrate several embodiments of the present invention. These drawings, together with the description, serve to explain the principles of the invention. The drawings are merely for the purpose of illustrating the preferred and alternative examples of how the invention can be made and used, and are not to be construed as limiting the invention to only the illustrated and described embodiments.

Furthermore, several aspects of the embodiments may form—individually or in different combinations—solutions according to the present invention. Further features and advantages will be become apparent from the following more particular description of the various embodiments of the invention as illustrated in the accompanying drawings, in which like references refer to like elements, and wherein:

BRIEF DESCRIPTION OF THE DRAWINGS

FIG. 7 shows a busbar connection system connected to another power distribution system according to a third embodiment of the invention.

DETAILED DESCRIPTION

Figure 1:
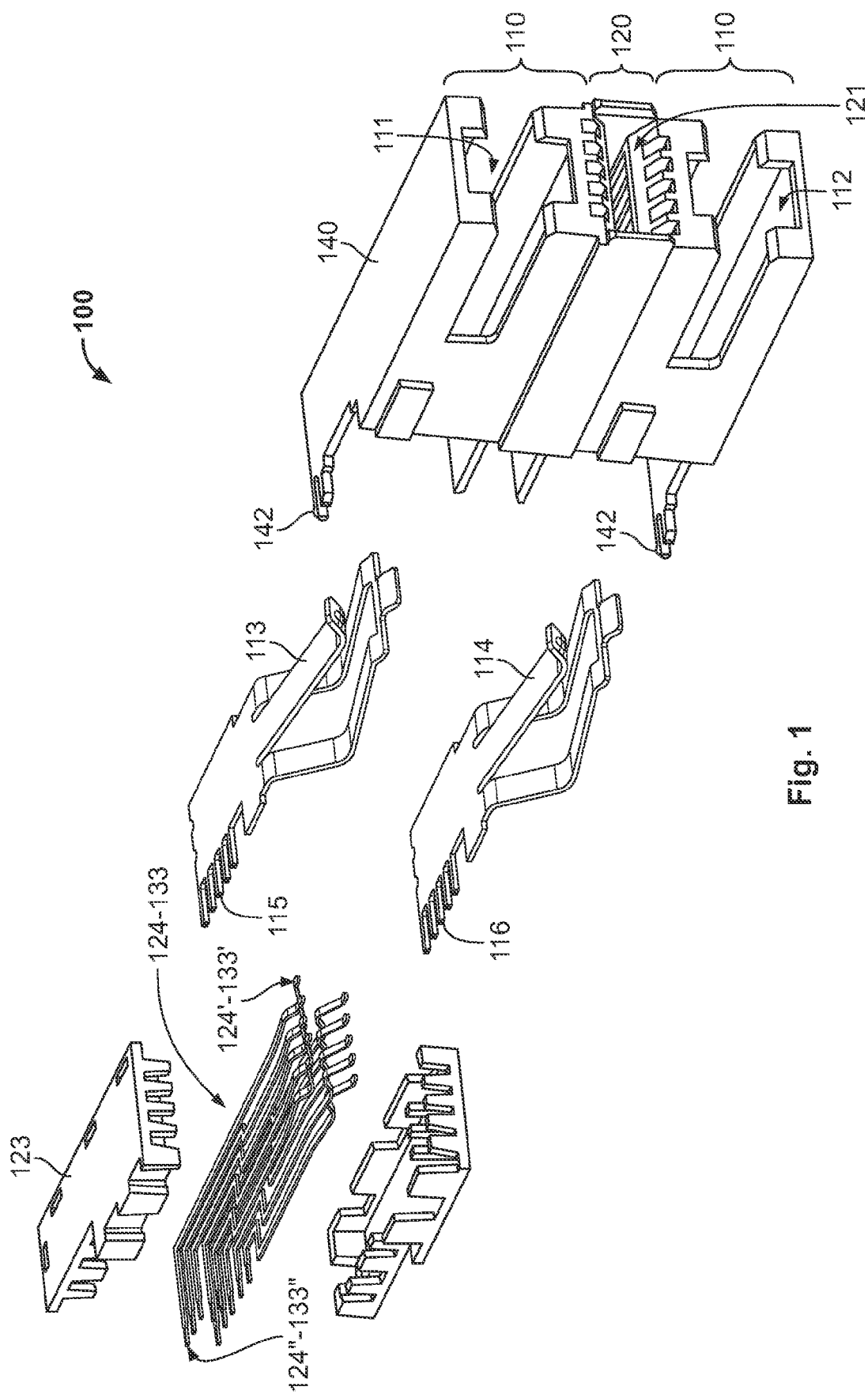
FIG. 1 shows a busbar connection system as an exploded view drawing according to a first embodiment of the invention.

Referring to FIG. 1, the busbar connection system 100 according to a first embodiment of the invention is illustrated. FIG. 1 shows an exploded view drawing of the busbar connection system 100.

The busbar connection system 100 is configured to mate with a power distribution system 200. The power distribution system 200 includes a busbar 210 and a link module 220. The busbar 210 enables power transmission from the power distribution system 200 to the busbar connection system 100; the link module 220 enables data transmissions in-between the power distribution system 200 and the busbar connection system 100.

In more detail, the busbar 210 of the power distribution system 200 includes at least two conductors 211 and 212 supplied with direct or alternating current. Depending on the application, the two or more conductors 211 and 212 are supplied with different potentials (AC/DC current, three-phase current, etc.). The link module 220 may be positioned in-between two of the at least two conductors 211 and 212 of the busbar 210.

Exemplarily, the at least two conductors 211 and 212 of the busbar 210 are realized as horizontal strip conductors spaced apart in a predetermined distance. In this respect, depending on the length of the horizontal strip conductors in the power distribution system, a number of electrical devices can be connected thereto.

The busbar connection system 100 includes a busbar connector 110. The busbar connector 110 is configured to receive the at least two conductors 211 and 212 of the busbar 210 and is configured to electrically contact each of the at least two conductors 211 and 212. By electrically contacting each of the at least two conductors 211 and 212 of the busbar 210, the busbar connector 110 enables power transmission from the power distribution system 200 to the busbar connection system 100.

In more detail, the busbar connector 110 includes at least two openings 111 and 112 for receiving the respective at least two conductors 211 and 212 of the busbar 210. The openings 111 and 112 are vertically spaced apart from each other at a distance that corresponds to the predetermined distance between the at least two conductors 211 and 212.

Further, the at least two openings 111 and 112 of the busbar connector 110 are defined by an open cross-section along the mating direction of the busbar connection system 100. In other words, the busbar connector 110 has a cross-section along the mating direction that opens towards the side-face of the busbar connection system 100. In this respect, the at least two openings 111 and 112 are not only located on the front-face of the busbar connection system 100 but also extend towards the side-face thereof.

Consequently, the at least two openings 111 and 112 of the busbar connector 110 form a channel for receiving respectively the at least two conductors 211 and 212 of the busbar 210. In this respect, the openings 111 and 112 enable the busbar connector 110 to partially surround the at least two conductors 211 and 212 of the busbar 210 on opposite sides.

Moreover, the openings 111 and 112 of the busbar connector 110 are adapted according to the traverse section (profile) of the at least two conductors 211 and 212 of the busbar 210, respectively.

In the exemplary realization of the busbar 210 with horizontal strip conductors, the openings 111 and 112 allow for the busbar connector 110 to cover a segment of the upward-facing and a segment of the downward-facing surface of the respective horizontal strip conductor. In other words, the openings 111 and 112 of the busbar connector 110 enable the respective horizontal strip conductors of the busbar 210 to laterally protrude (i.e. to stick out from the sides) of the busbar connector 110.

In order to electrically contact each of the at least two conductors 211 and 212 of the busbar 210, the busbar connector 110 includes at least two contact members 113 and 114 respectively arranged within the at least two openings 111 and 112. In other words, a single of the at least two contact members 113 and 114 is provided within each of the at least two openings 111 and 112 of the busbar connector 110. In this respect, each of the at least two contact members 113 and 114 of the busbar connector 110 electrically contacts a respective of the at least two conductors 211 and 212 of the busbar 210.

Advantageously, the at least two contact members 113 and 114 are configured to electrically contact the respective conductor at three contact points forming a triangle in a plane which is essentially orthogonal with respect to the surface of the respective conductor. Further, the at least two contact members 113 and 114 are configured to apply a contact force on opposite sides (i.e. with one contact point on one side and two contact points on an opposite side) onto each of the at least two conductors 211 and 212 of the busbar 210.

Due to the three contact point configuration of the contact members 113 and 114, the busbar connector 110 achieves tolerating small deviation with respect to the straight horizontal extent of each of the at least two conductors 211 and 212 of the busbar 210 and predefined distance therebetween. In other words, the three contact point configuration of the contact member 113 and 114 of the busbar connector 110 allows compensating for minor bends in one of the at least two conductors 211 and 212 of the busbar 210 and for minor variations in the distance therebetween.

Further, due to the contact members 113 and 114 applying a contact on opposite sides, the busbar connector 110 achieves tolerating small deviations with respect to the thickness of each of the at least two conductors 211 and 212 of the busbar 210.

Accordingly, this exemplary realization of the contact members 113 and 114 improves the capability to electrically contact each of the at least two conductors 211 and 212.

Further, the busbar connection system 100 includes a signal connector 120. The signal connector 120 is configured to receive the link module 220 with a plurality of contact pads 221 to 230 of the power distribution system 200. Additionally, the signal connector 120 allows for electrically contacting each of the plurality of contact pads 221 to 230 of the link module 220 of the power distribution system 200.

In order to electrically contact each of the plurality of contact pads 221 to 230 of the link module 220, the signal connector 120 may be provided with a contact insert 123. The contact insert 123 can be detachably arranged within the signal connector 120 and includes a plurality of contact members 124 to 133 for electrically contacting the plurality of contact pads 221 to 230 of the link module 220, respectively.

Usually, the signal connector 110 of the busbar connection system 100 is provided with the contact insert 123 so as to allow data transmissions in between the power distribution system 200 and the busbar connection system 100. Nonetheless, there are situations where it is advantageous to detach the contact insert 123 from the signal connector 120 of the busbar connection system 100.

As will be explained in more detail in connection with FIG. 6, in case of joining a plurality of busbar connection systems 100 to each other for increasing an overall current rating, a single contact insert 123 suffices for the plurality of joint busbar connection systems 100 to enable data transmission with the power distribution system 200.

In more detail, the signal connector 120 has an opening 121 to receive the link module 220 of the power distribution system 200. Advantageously, the opening 121 of the signal connector 120 is arranged between two of the at least two openings 111 and 112 of the busbar connector 110. Thereby, a smaller profile of the busbar connection system 100 may be realized.

Further, the opening 121 of the signal connector 120 is defined by a closed cross-section along the mating direction of the busbar connection system 100. In other words, the signal connector 120 has a cross-section along the mating direction that is closed towards the side-face of the busbar connection system 100. In this respect, the opening 121 of the signal connector 120 is located on the front-face of the busbar connection system 100, only.

Accordingly, the opening 121 enables the signal connector 120 to guide the link module 220 into a contacting position for electrically contacting the plurality of contact pads 221-230. In other words, due to the opening 121 of the signal connector 120 guiding the link module 220 into the contacting position, a lateral displacement between the contact pads 221-230 of the link module 220 and the contact members 124-133 of the contact insert 123 of the signal connector 120 is prevented.

Advantageously, the contact members 124 to 133 of the contact insert 123 are realized as card-edge style contacts. As card-edge style contacts, the contact members 123 to 133 are configured to apply a contact force in a direction essentially perpendicular to the mating direction. This realization of the contact members 124 to 133 enables the mating force and the contact force to be independent from each other, thereby preventing adverse interaction therebetween.

Further, a realization of the contact members 124 to 133 of the contact insert 123 as card-edge style contacts provides for the additional advantage of improving the ability of establishing an electrical contact. During mating, the card-edge style contacts 124 to 133 of the contact insert 123 are configured to slide on the respective contact pads 221 to 230 of the card-edge style link module 220 thereby removing dirt, dust or a thin corrosive layer from the surface of the contact pads 221 to 230. In this respect, an intermediate layer on the surface of the link module 220 that could prevent the contact members 124 to 133 from electrically contacting the respective contact pads 221 to 230 is removed during mating.

Exemplarily, the contact insert 123 is arranged in the signal connector 120 of the busbar connection system 100 such that the tip portions 124' to 133' of the contact members 124 to 133 thereof are recessed with respect to the tip portions of contact members 113 and 114 of the busbar connector 110. In other words, the tip portions of the contact members 113 and 114 of the busbar connector 110 protrude further in the direction of the front-face of the busbar connection system 100 than the tip portions 124' to 133' of the contact members 124 to 133 of the contact insert 123 when arranged within the signal connector 120.

Advantageously, the above described arrangement of the contact insert 123 within the signal connector 120 allows for the busbar connection system 100 to be hot pluggable; during mating, the contact members 113 and 114 of the busbar connector 110 electrically contact the respective conductors of the busbar 210 before the contact members 124 to 133 of the contact insert 123 electrically contact the respective contact pads of the link module 220. Accordingly, this arrangement within the busbar connection system 100 activates the power transmissions before data transmission during the mating movement such that the busbar connection system is hot pluggable.

Advantageously, a same number of contact members 124 to 133 of the contact insert 123 are provided for electrically contacting the respective contact pads 221 to 223 of the link module 220 on opposite sides. In other words, a first subset of contact members 124 to 133 is provided to contact the respective contact pads 221 to 230 on one side whereas a second subset of contact members 124 to 133 is provided to contact the respective contact pads 221 to 230 on the opposite side. By configuring the first and second subset to consist of a same number of contact members 124 to 133, the lateral extent of the link module 220 can be minimized.

The busbar connection system 100 further comprises a housing 140 integrally manufactured to house the busbar connector 110 and the signal connector 120. The housing 140 of the busbar connection system 100 may be realized of molded resin or plastic material. Specifically, the housing 140 of the busbar connection system 100 may be formed of high temperature resistant material so as to allow usage of the busbar connection system 110 for high temperature applications.

Further, the busbar connection system 100 comprises fixtures 142 for fixing the busbar connection system 100 to a system board 150. The fixtures 142 may be realized as self-retaining board locks integrally manufactured to the housing 140 of the busbar connection system, which clip into holes in the system board 150.

Advantageously, the fixtures 142 of the busbar connection system 100 allow fixing the busbar connection system 100 to the system board 150 in essentially an orthogonal direction with respect to the lateral extent of each of the at least two openings 111 and 112 of the busbar connector 110. Thereby, a mating distance on the power distribution system 200 between subsequent busbar connection systems 100 and respectively attached system boards 150 can be minimized.

In other words, the fixtures 142 of the busbar connection system 100 allow mounting the busbar connection system 100 to the system board 150 such that the system board 150 is essentially parallel with respect to the longitudinal extent of the busbar connection system 100, namely essentially parallel with respect to a (horizontal) plane defined by the positions of the at least two, spaced apart, openings 111 and 112 of the busbar connector 110.

In combination with the above described fixtures 142, it is further advantageous to provide each of the plurality of contact members 124 to 133 of the contact insert 123 with an angled terminal 124" to 133" for electrically connecting the system board 150. Similarly, it is also advantageous to provide each of the at least two contact members 113 and 114 with angled terminals for electrically connecting to the system board 150.

In summary, as can be readily appreciated from the discussion above, the configuration of the busbar connection system 100 allows for integration of a busbar connector 110 for power transmissions and a signal connector 120 for data transmissions.

Specifically, the structure of the busbar connection system 100 enables establishing both a power and a data connection with the power distribution system 200 in a single mating movement. In more detail, due to the at least two openings 111 and 112 of the busbar connector 110 and the opening 121 of the signal connector 120 being positioned at least partially on the front-face of the busbar connection system 100, the single mating movement with the power distribution system 200 becomes possible.

Figure 2:
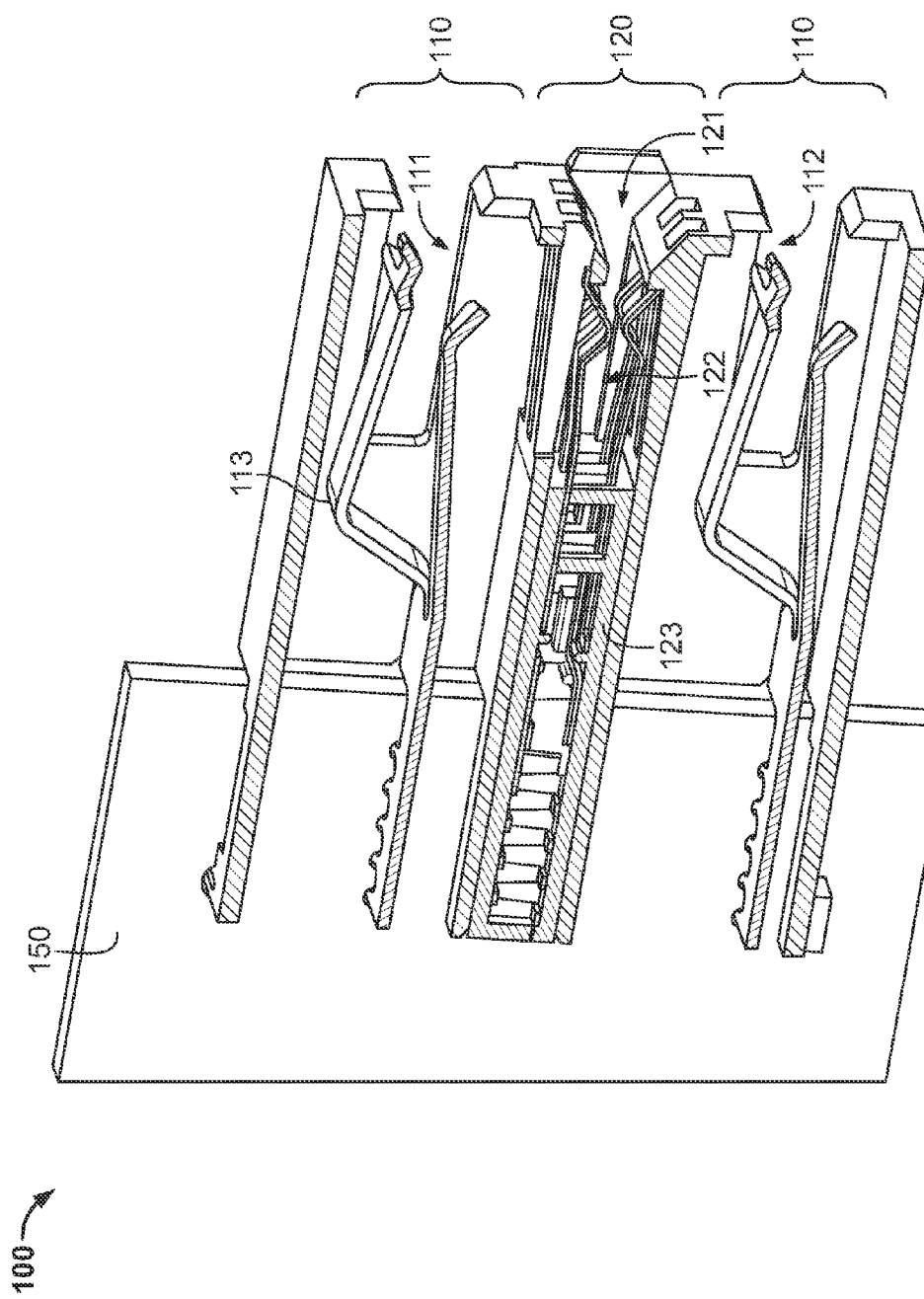
FIG. 2 shows a cross-sectional view of the busbar connection system according to the first embodiment of the invention.

Referring now to FIG. 2, the busbar connection system 100 according to the first embodiment is shown in a cross-sectional view. Specifically, a cross-section of the busbar connection system 100 of FIG. 1 along the mating direction is shown in FIG. 2.

In other words, the cross-section of the busbar connection system 100 shown in FIG. 2 is in a plane defined by the longitudinal extent of the busbar connection system 100 with respect to the mating direction. More particularly, the cross-section shown in FIG. 2 corresponds to a (horizontal) plane defined by the positions of the at least two, spaced apart, openings 111 and 112 of the busbar connector 110.

The cross-section defining the at least two openings 111 and 112 of the busbar connector 110 is the same cross-section defining the opening 121 of the signal connector 120. Moreover, with respect to this same cross-section along the mating direction, the busbar connector 110 opens towards the side-face of the busbar connection system 100, whereas the signal connector 120 is closed (does not open) towards the side-face of the busbar connection system 100.

Accordingly, the at least two openings 111 and 112 of the busbar connector 110 are not only located on the front-face of the busbar connection system 100 but also extend towards the side-face thereof. At the same time the opening 121 of the signal connector 120 is located on the front-face of the busbar connection system 100, only.

Notably, by defining the cross-section along the mating direction of the busbar connection system 100, it can be assured that any reference to an open cross-section along same mating direction corresponds to channel-shaped openings within the busbar connector 110 which extends in the mating direction. In other words, for a cross-section along the mating direction to be open, the busbar connector 100 includes openings which extend from the front-face towards the side-face of the busbar connection system 100.

In this respect, the at least two openings 111 and 112 of the busbar connector 110 extend in a mating direction of the busbar connection system 100. At the same time, the opening 121 enables the signal connector 110 to guide the link module 220 to a contacting position for electrically contacting the plurality of contact pads.

Advantageously, the signal connector 110 includes guiding rails 122 for guiding the link module 220 into the contacting position. Exemplarily, the guiding rails 122 of the signal connector 110 are realized as longitudinal recesses in the inner side wall of the signal connector 110. Alternatively, the guiding rails 122 of the signal connector 110 may also be realized as longitudinal protrusions on the inner side wall of the signal connector 110 where the protrusion engages into a corresponding recess in the link module 220 for guiding same to the contacting position. In any case, the guiding rails 122 of the signal connector 110 extend in a direction along the mating direction of the busbar connection system 100.

Further, the plurality of contact members 124 to 133 of the contact insert 123 are advantageously secured apart from each other within the signal connector 120, in order to prevent a lateral dislocation therein.

For this purpose, each of the plurality of contact members 124 to 133 of the contact insert 123 has an elongated tip portion 124' to 133' configured to engage into a respective of a plurality of spaced apart recesses 143 to 152. Due to a separation by a plurality of spaced apart recesses 143 to 152, each of the plurality of contact members 124 to 133 is prevented from coming into contact with another of the plurality of contact members 124 to 133. Exemplarily, the plurality of recesses 143 to 152 are provided at the inner circumference of the opening 121 of the signal connector 120.

Further, it can be readily appreciated that the busbar connection system 100 enables cooling air to flow through the busbar connector 110 in a mating direction. For this purpose, the busbar connector 110 has on the front-face and the rear-face of the busbar connection system 100 further openings. Exemplarily, the at least two openings 111 and 112 of the busbar connector 110 are widened on the front-face of the busbar connection system 100. At the same time, the busbar connector 110 does not have a rear wall on the rear-face of the busbar connection system 100. In this respect, air (e.g. cooling air) can flow through the busbar connection system.

In summary, as can be readily appreciated from the discussion above, the configuration of the busbar connection system 100 allows for integration of a busbar connector 110 for power transmissions and a signal connector 120 for data transmissions.

Specifically, the structure of the busbar connection system 100 enables establishing both a power and a data connection with the power distribution system 200 in a single mating movement. In more detail, due to the at least two openings 111 and 112 of the busbar connector 110 extending in the mating direction and the signal connector 120 providing guiding rails 122 extending along the mating direction, the single mating movement with the power distribution system 200 becomes possible.

Figure 3:
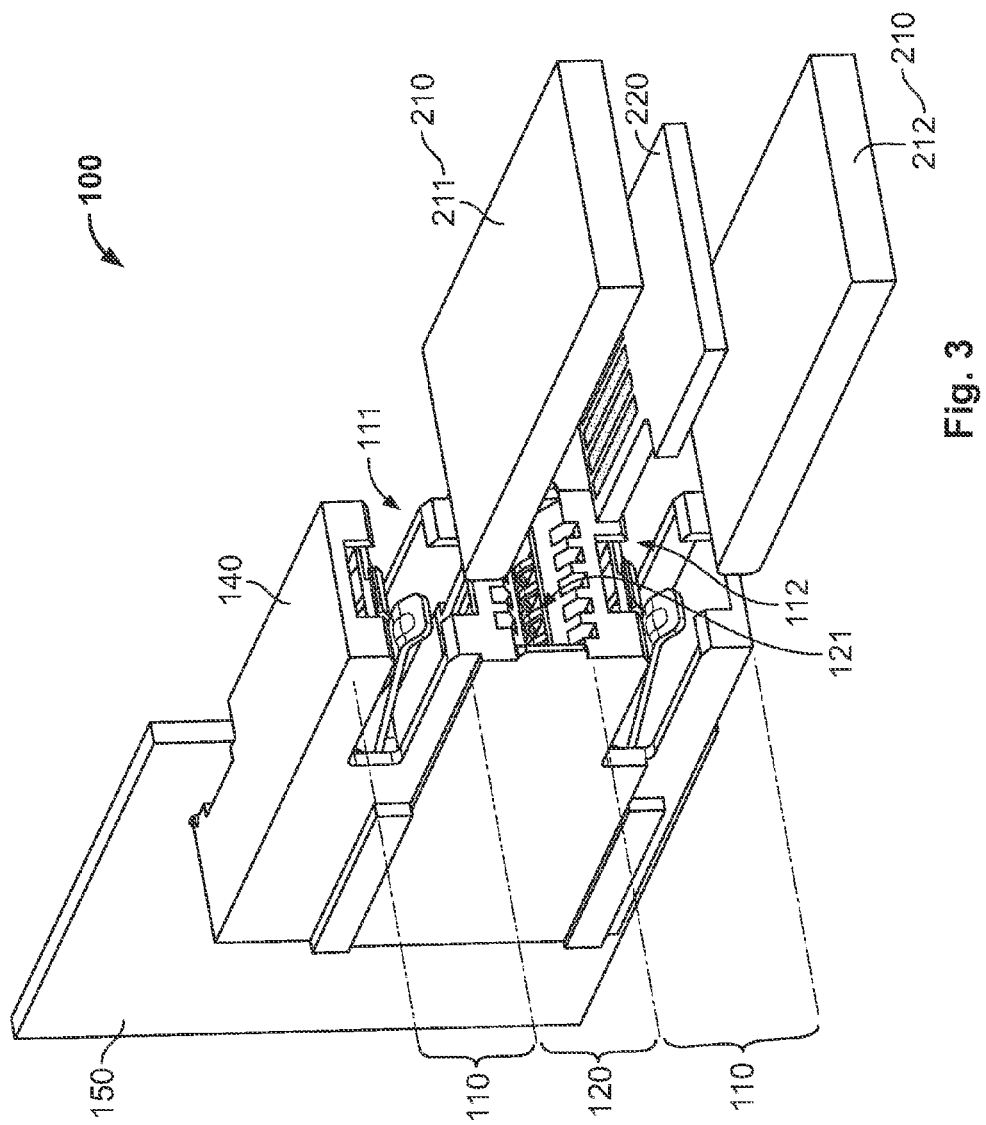
FIG. 3 shows the busbar connection system according to the first embodiment of the invention together with the power distribution system.
Figure 4:
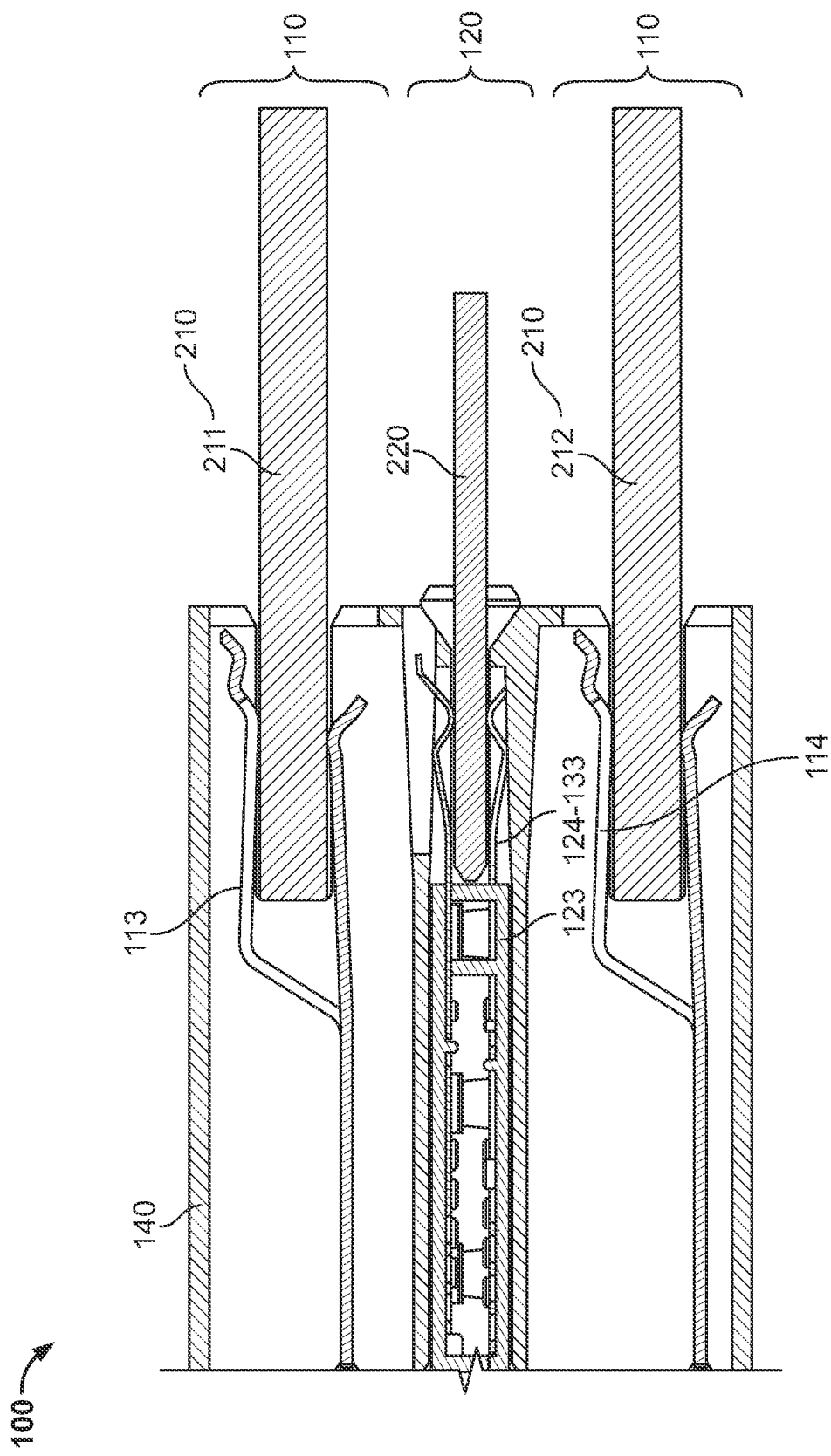
FIG. 4 shows a cross-sectional view of the busbar connection system connected to the power distribution system according to the first embodiment of the invention.
Figure 5:
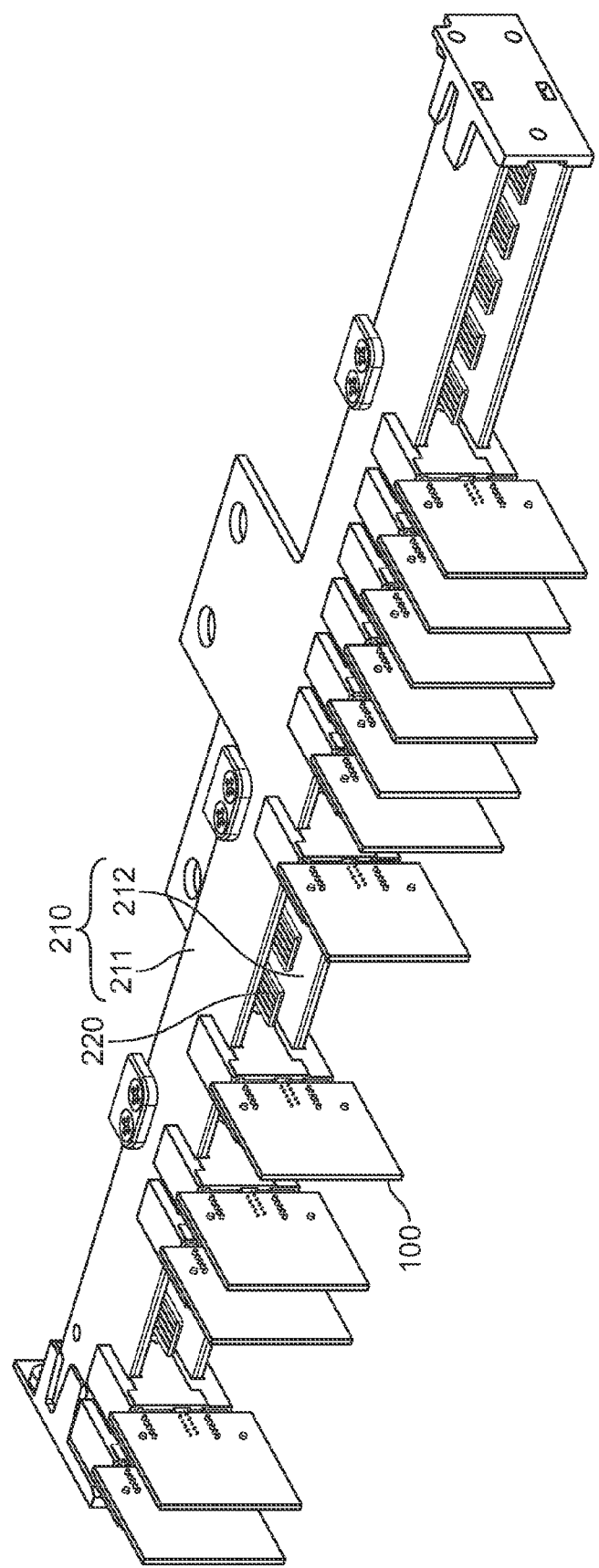
FIG. 5 shows a plurality of busbar connection systems connected to the power distribution system according to the first embodiment of the invention.

Referring now to FIGS. 3, 4 and 5, different views of the busbar connection system 100 according to the first embodiment together with the power distribution system 200 are shown. Specifically, FIG. 3 shows the busbar connection system 100 together with the power distribution system 200 in a non-connected state; FIG. 4 shows a cross-sectional view of the busbar connection system connected to the power distribution system; and FIG. 5 shows a plurality of electrical devices each including at least one busbar connection system connected to the power distribution system.

An electrical device according to the invention includes at least one busbar connection system 100, 300 or 400 according to one of the described embodiments, and a system board 150 for mounting the at least one busbar connection system 100, 300 or 400 and for power transmission via the busbar connector(s) 110 or 410 and for data transmission via the signal connector(s) 120 with the at least one power distribution system 200 or 500.

Specifically, the power distribution system 200 is shown to include the busbar 210 with at least two conductors 211 and 212. Exemplarily, the at least two conductors 211 and 212 of the busbar 210 are realized as horizontal strip conductors spaced apart in a predetermined distance. In this respect, depending on the length of the horizontal strip conductors in the power distribution system 200, the number of electrical devices that can be connected thereto varies.

Further, the power distribution system 200 includes a plurality of link modules 220 positioned in-between the conductors 211 and 212 of the busbar 210. Exemplarily, the link module 220 may be realized as a printed circuit board with five contact pads on each side.

Figure 6:
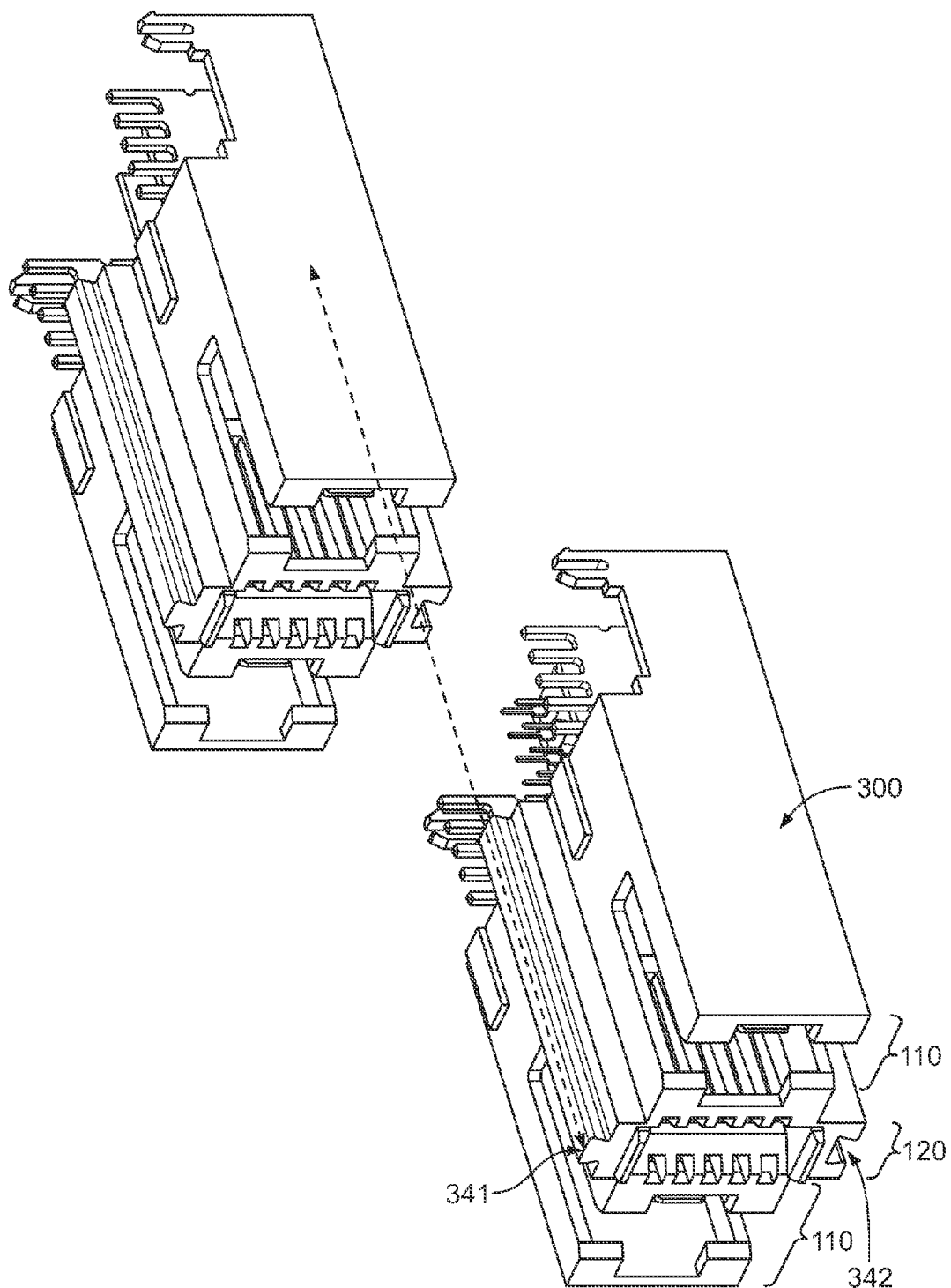
FIG. 6 shows a busbar connection system according to a second embodiment of the invention.

Referring now to FIG. 6 a busbar connection system 300 according to the second embodiment of the invention is shown. The busbar connection system 300 of FIG. 6 is based on the busbar connection system 100 of FIGS. 1-5 where corresponding parts are given corresponding reference numerals and terms. The description of corresponding parts has been omitted for reasons of conciseness.

The busbar connection system 300 of FIG. 6 differs from the busbar connection system 100 in that it additionally includes on its side-face a joint 341 for joining the busbar connection system 300 to another busbar connection system (dashed arrow in FIG. 6).

Specifically, the joint 341 is provided on one side-face of the busbar connection system 300 so as to allow joining it with another busbar connection system such that the openings 111 and 112 of the busbar connector 110 and the opening 121 of the signal connector 120 are in alignment with the respective openings of the other busbar connection system. Thereby, the joint 341 of the busbar connection system 300 enables simultaneously connecting both the busbar connection system 300 and the joined other busbar connection system to the power distribution system 200.

Advantageously, by joining a busbar connection system 300 to another busbar connection system, the current rating of the joint busbar connection system increases. Moreover, a busbar connector 110 of a busbar connection system 300 has only a limited current carrying capability.

Exemplarily, the current rating for a busbar connector 110 of the busbar connection system 300 is 20 amperes (20 A). By combining a plurality of busbar connection systems to each other, the overall current rating linearly increases (two joint systems result in 40 amperes overall current rating; three joint systems result in 60 amperes; and so forth).

In this respect, it shall become apparent that the second embodiment is not limited to only forming pairs (two) of busbar connection systems. In addition to a joint 341 provided on one side-face of the busbar connection system 300, a further joint 342 may be provided on the opposite side-face of the busbar connection system 300. In this respect, it may also be possible to form triplets (three) or more of busbar connection systems.

In detail, since contact members 113 and 114 of the busbar connector 110 within busbar connection system 300 have only a limited contact surface for electrically contacting the respective conductors 211 and 212 of the busbar 210, the current carrying capability is restricted. By joining a plurality of busbar connection systems to each other, the contact surface for electrically contacting conductor 211 or 212 increases, and thus, the overall current rating of the joint busbar connection system improves.

Exemplarily, joint 341 of busbar connection system 300 may be realized as a sliding dovetail joint arranged for sliding same joint in a respective socket joint provided on a side-face of another busbar connection system.

Advantageously, the sliding dovetail joint 341 extends on the side wall of the busbar connection system 300 along the mating direction so as to prevent horizontal misalignment between the openings 111 and 112 of the busbar connector 110 and the opening 121 of the signal connector 120 and the respective openings of the other busbar connection system.

In other words, even if the sliding dovetail joint of the busbar connection system 300 and the respective socket joint of the other busbar connection system are not entirely assembled (longitudinal displacement), the openings of the busbar connection system 300 are in alignment with the respective openings of the other busbar connection system.

As already explained above, the joint 341 is provided for increasing the current rating of the busbar connection system 300 without modifications to the contact members 113 and 114 of the busbar connector 110 themselves. This is achieved by the busbar connection sensor 300 making use of the contact members of another busbar connector 110 included in another busbar connection system 300. In other words, two joint busbar connection systems are used for transmitting power from the power distribution system to a single electrical device. In this configuration of joint busbar connection systems, even though two separate data transmission are possible, only a single connection is required to enable data transmission between the electrical device and the power distribution system 200. Moreover, regardless of the number of joint busbar connection systems, only a single electrical device provided with the joint busbar connection systems requires data transmission with the power distribution system.

In other words, in case of joining a plurality of busbar connection systems 300 to each other for increasing an overall current rating, a single contact insert 123 suffices for the plurality of joint busbar connection systems 300 to enable data transmission with the power distribution system 200.

In this respect, the contact insert 123 of the signal connector 120 of the busbar connection system 300 may advantageously be detached from busbar connection system(s) such that only a single contact insert 123 remains in one of the joint busbar connection systems. Consequently, the busbar connection system 300 provides for a clean and easy design with respect to scalability and an additional advantage of cost efficiency due to the ability to remove the contact insert 123 when not needed.

In summary, as can be readily appreciated from the discussion above, the configuration of the busbar connection system 300 allows for integration of a busbar connector 110 for power transmissions and a signal connector 120 for data transmissions while at the same time achieving scalability by providing a joint 341 for joining multiple busbar connection systems 300 together.

Specifically, the structure of the joint busbar connection systems 300 enables establishing a power and a data connection with the power distribution system 200 in a single mating movement. In more detail, due to the at least two openings 111 and 112 of the busbar connector 110 of the busbar connection system 300 and the opening 121 of the signal connector 120 being in alignment with the respective openings of the other, joint busbar connection system, the single mating movement with the power distribution system 200 becomes possible.

Referring now to FIG. 7 a busbar connection system 400 according to the third embodiment of the invention is shown. The busbar connection system 400 of FIG. 7 is based on the busbar connection system 100 of FIGS. 1-5 where corresponding parts are given corresponding reference numerals and terms. The description of corresponding parts has been omitted for reasons of conciseness.

The busbar connection system 400 of FIG. 7 differs from the busbar connection system 100 in that it includes a different busbar connector 410 instead of busbar connector 110. At the same time, the busbar connection system includes signal connector 120 of the first and second embodiment.

Specifically, the busbar connector 410 is configured to receive three conductors 211, 212 and 413 of the busbar 510 and is configured to electrically contact each of the three conductors 211, 212 and 413. By electrically contacting each of the three conductors 211, 212 and 413 of the busbar 510, the busbar connector 410 enables power transmission from the power distribution system 500 to the busbar connection system 400. This busbar connection system 400 may be used with three-phase current for motor and high power appliances.

Advantageously, the busbar connection system 400 of the third embodiment can be jointly utilized with a busbar connection system 100 or 300 of the first or second embodiment on the power distribution system 500 comprising a busbar 510 with three conductors 211, 212 and 413 and link module 220 between two of the at least two conductors 211, 212 and 413.

REFERENCES

| Reference Numerals | Description |
| --- | --- |
| 100, 300, 400 | Busbar connection system |
| 110, 410 | Busbar connector |
| 111, 112 | Opening |
| 113, 114 | Contact member |
| 115, 116 | Terminal of contact member |
| 120 | Signal connector |
| 121 | Opening |
| 122 | Guiding rail(s) |
| 123 | Contact insert |
| 124-133 | Contact member(s) |
| 124'-133' | Tip of a contact member(s) |
| 124"-133" | Terminal of contact member(s) |
| 140 | Housing |
| 341, 342 | Joint |
| 142 | Fixtures |
| 143-152 | Recess(es) |
| 150 | System board |
| 200, 500 | Power distribution system |
| 210, 510 | Busbar |
| 211, 212 | Conductor |
| 220 | Link module |
| 221-230 | Contact pad(s) |

The invention claimed is:

1. A busbar connection system for mating with a power distribution system including a busbar and a link module, the busbar connection system comprising:
 a busbar connector for receiving at least two conductors of the busbar and for electrically contacting each of the at least two conductors; and
 a signal connector for receiving the link module with a plurality of contact pads and for electrically contacting each of the plurality of contact pads;
wherein:
 the busbar connector has at least two, spaced apart, openings defined by an open cross-section along a mating direction, the at least two openings enable the busbar connector to partially surround, on opposite sides, each of the at least two conductors of the busbar, and
 the signal connector has an opening defined by a closed cross-section along the mating direction, the opening enables the signal connector to guide the link module into a contacting position for electrically contacting the plurality of contact pads.

2. The busbar connection system according to claim 1, wherein the cross-section defining the at least two openings of the busbar connector is the same cross-section defining the opening of the signal connector, and/or wherein the signal connector is arranged between two of the at least two openings of the busbar connector.

3. The busbar connection system according to claim 1, further comprising a housing integrally manufactured to house the busbar connector and the signal connector, and optionally provided on its side-face with a joint for joining the busbar connection system to another busbar connection system.

4. The busbar connection system according to claim 1, wherein the signal connector further includes guiding rails for guiding the link module into the contacting position, the guiding rails extending along the mating direction of the busbar connection system.

5. The busbar connection system according to claim 1, further comprising:
 a contact insert detachably arranged within the signal connector including a plurality of contact members for electrically contacting the plurality of contact pads of the link module, respectively.

6. The busbar connection system according to claim 5, wherein the plurality of contact members of the contact insert are card-edge style contacts configured to apply a contact force in a direction essentially perpendicular to the mating direction.

7. The busbar connection system according to claim 5, wherein the contact insert is provided with a same number of the contact members for electrically contacting respective contact pads of the link module on opposite sides.

8. The busbar connection system according to claim 5, wherein a tip portion of each of the plurality of contact members of the contact insert respectively engages into one of a plurality of recesses at the inner circumference of the opening of the signal connector.

9. The busbar connection system according to claim 5, wherein the plurality of contact members of the contact insert are provided with angled terminals for connection to a system board.

10. The busbar connection system according to claim 1, wherein the busbar connector includes at least two contact members respectively arranged within the at least two openings; and wherein each of the contact members is configured: to electrically contact the respective conductor at three contact points, and to apply a contact force on opposite sides onto the respective conductor of the busbar.

11. The busbar connection system according to claim 10, wherein the front and the rear face of the busbar connector includes further openings enabling air to flow through the busbar connection system.

12. The busbar connection system according to claim 1, further comprising fixtures for fixing the busbar connection system to a system board in a direction with respect to the mating direction.

13. The busbar connection system according to claim 12, wherein the fixtures are configured to fix the busbar connection system onto the system board in essentially an orthogonal direction with respect to the lateral extent of each of the at least two openings of the busbar connector.

14. Electrical device comprising:
 at least one busbar connection system according to claim 1; and
 a system board for mounting the busbar connection system and for power transmission via the busbar connector(s) and for data transmission via the signal connector(s) (120) with the power distribution system.

15. Electrical system, comprising:
 at least one electrical device according to claim 14; and
 a power distribution system, the power distribution system including a busbar and a link module, wherein the link module is a printed circuit board, PCB, with a same number of contact pads on opposite sides.

* * * * *